United States Patent [19]

Koomen et al.

[11] 4,317,690
[45] Mar. 2, 1982

[54] SELF-ALIGNED DOUBLE POLYSILICON MOS FABRICATION

[75] Inventors: Joannes J. M. Koomen, Los Altos, Calif.; Roelof H. W. Salters, Eindhoven, Netherlands

[73] Assignee: Signetics Corporation, Sunnyvale, Calif.

[21] Appl. No.: 160,668

[22] Filed: Jun. 18, 1980

[51] Int. Cl.³ .................... H01L 21/22; H01L 21/31; H01L 21/263

[52] U.S. Cl. ..................... 148/187; 29/571; 29/576 B; 29/578; 148/1.5; 357/23; 357/59; 357/91

[58] Field of Search ................ 148/1.5, 187; 29/571, 29/576 B, 578; 357/23, 59, 91

[56] References Cited

U.S. PATENT DOCUMENTS

| | | | |
|---|---|---|---|
| 3,841,926 | 10/1974 | Garnache et al. | 148/188 |
| 4,062,707 | 12/1977 | Mochizuki et al. | 148/187 |
| 4,075,045 | 2/1978 | Rideout | 148/187 |
| 4,102,733 | 7/1978 | De La Moneda | 156/653 |
| 4,142,926 | 3/1979 | Morgan | 148/187 |

FOREIGN PATENT DOCUMENTS

2639039 3/1978 Fed. Rep. of Germany ...... 148/187
2312856 12/1976 France .

OTHER PUBLICATIONS

Fortino et al. IBM-TDB, 20 (1978) 4286.
Abbas et al. IBM-TDB, 18 (1976) 3288.
Boss et al. IBM-TDB, 10 (1967) 164.
Rideout et al., in Int.² Electron Device Meeting, Tech. Digest, Washington, D.C., Dec. 1976, p. 593.

*Primary Examiner*—Upendra Roy
*Attorney, Agent, or Firm*—Jerry A. Dinardo; Robert T. Mayer; Thomas A. Briody

[57] ABSTRACT

A method of fabricating a double polysilicon MOS structure of reduced size employs local oxidation of polysilicon to define and isolate a first polysilicon layer. Prior to etching the first polysilicon layer, a first masking step defines one of the elements of the MOS transistor, such as the source. By selectively etching the first polysilicon layer, the isolation regions and then the other elements of the MOS transistor are defined. With only slight variations in the simplified process, either a plurality of one MOS transistor-one capacitor memory cells or a plurality of MOS transistors can be fabricated.

14 Claims, 22 Drawing Figures

Third Mask Etch Nitride

P+ Implant Plus Oxidation

Grow Thin Oxide

Apply First Mask Plus Etch Oxide

Deposit Poly Plus Nitride

Second Mask Etch Nitride

Diffuse N+ (or Implant)

Thermally Oxidize Polysilicon (LOCOS)

Third Mask Etch Nitride

Etch Poly

P+ Implant Plus Oxidation

Etch Nitride Plus Poly

Dip Oxide, Grow Thin Oxide, Grow Second Poly

BITLINE    FIELD PLATE

SELF-ALIGNED DOUBLE POLYSILICON MOS FABRICATION

BACKGROUND OF THE INVENTION

This invention relates to integrated circuit arrays of single capacitor, single MOS transistor memory cells, and more particularly to an improved method of fabricating such cells.

Conventional processes for fabricating MOS memories using a single capacitor and a single MOS transistor utilize several photolithographic masking steps that require strict alignment tolerances, thereby greatly reducing the effective area of the cell and limiting the achievable cell density. Accordingly, there is a strong need for a process that greatly reduces the number of masking steps where alignment is critical.

SUMMARY OF THE INVENTION

In the process according to the invention, a memory cell structure of the kind described above is realized without the need for any critical alignment steps. The resulting memory cell structure utilizes the memory cell area more effectively so that a more dense memory is achieved.

A first step in the process comprises the formation of a first thin insulating layer, such as silicon dioxide, on a semiconductor substrate of first conductivity type. A first masking procedure is then carried out to produce openings in the first insulating layer. These openings define the outer limits of the locations of the individual cell structure itself. A first layer of polysilicon is deposited on the first thin insulating layer and then an oxide barrier layer, such as silicon nitride, is deposited on the first polysilicon layer.

The second masking procedure is carried out on the oxide barrier layer. This single mask provides openings in the oxide barrier layer that define the bit line and source, the cell capacitor field plate, the channel length of the MOS transistor between the bit line and the capacitor plate, and the isolation regions in the active area of the thin insulating layer. By locally oxidizing the first polysilicon layer, there is provided a silicon dioxide protection layer overlying both the bit line and the capacitor field plate. The silicon dioxide protection layer is self-aligned with the oxide barrier layer mask.

By using the combination of the silicon dioxide layer on polysilicon and a selected part of the oxide barrier layer as a masking structure, a first polysilicon etch is performed to define the isolation regions. After total removal of the remaining oxide barrier layer and using the silicon dioxide layer alone as a masking structure, a second polysilicon etch is performed to define the cell transistor. A second deposited polysilicon layer forms the word line and also the gate electrode of the transistor.

Similar processing steps may be used to form a self-aligned source, drain, gate MOS transistor structure, wherein both source and drain are formed by the first polysilicon layer and the gate is formed by the second polysilicon layer. Also the isolation, when necessary, for the source and/or drain from other devices in the active silicon substrate area is performed in the same way as described above.

DESCRIPTION OF THE PREFERRED EMBODIMENT

Figure 1:
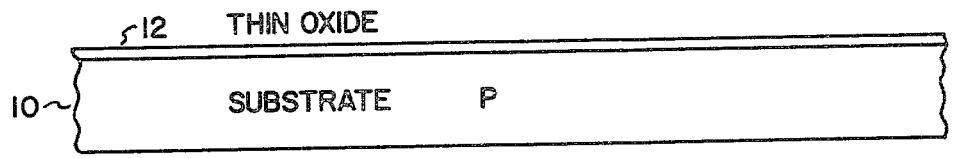
FIGS. 1-11 are cross-sectional views showing a single capacitor, single MOS transistor memory cell in various stages of a fabrication process according to the invention.

The fabrication of a memory cell structure begins with the provision of a semiconductor substrate and the preliminary formation thereon of the active areas and the so-called field areas, according to conventional practice. As an example, a silicon substrate will be described, and it will be provided with a dopant of first type conductivity, which may be P type. The substrate 10 is illustrated in FIG. 1 as having a P type conductivity.

The steps required for the formations of the active areas and the field areas will now be described but will not be shown in the drawing. The first step is to grow a thin layer of silicon dioxide on the silicon substrate 10 and then deposit a layer of silicon nitride on the oxide, the two layers having a composite thickness of about 1200 A. A first mask is then used to etch out strips from the nitride layer, leaving strip-like voids which at the bottom expose bare oxide, with the voids alternating with strips of silicon nitride.

Following the formation of the strips, an ion implant is performed to deposit in the silicon substrate surface beneath the strip-like voids a dopant impurity of the same type as contained in the substrate, in this case a P type impurity. This step is known as the field implant and results in heavily doped P type strips which isolate the separate active areas from each other.

After the field implant is formed, the silicon is locally oxidized in the void regions between the silicon nitride strips so that a layer of silicon dioxide strips of substantial thickness is formed. The silicon dioxide strips extend partly into the P+ field implant regions a distance below the level of the substrate surface and also extend a distance above the level of the substrate surface.

The silicon dioxide strips are known as the field or field insulation. The regions between the field oxide and field implant are known as the active regions. The active regions are insulated and isolated from each other by the combined field implant and field oxide regions.

The silicon nitride strips and the underlying silicon dioxide may then be removed, leaving only bare silicon in the active areas. This is the stage shown in FIG. 1, which is a cross section taken along the length of one of the active areas.

The active areas of the semiconductor substrate 10 are now provided with a thin first insulating layer 12. The insulating layer 12 may be a thin oxide layer that is thermally grown on the silicon surface by heating the silicon substrate 10 at an elevated temperature of about 1000° C. for a sufficient length of time to produce a silicon dioxide film of several hundred angstroms in thickness.

Figure 2:
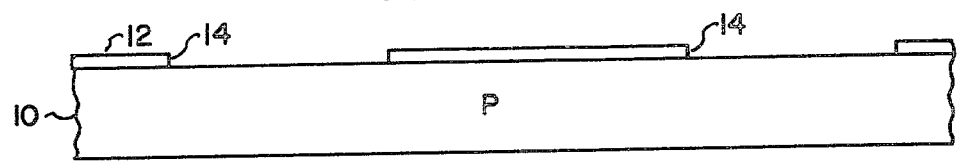

After the silicon dioxide layer 12 is formed, a first mask, not shown, is applied photolithographically, and by means of the mask the silicon dioxide layer 12 is etched selectively to produce openings 14 of equal size, as shown in FIG. 2.

Figure 3:
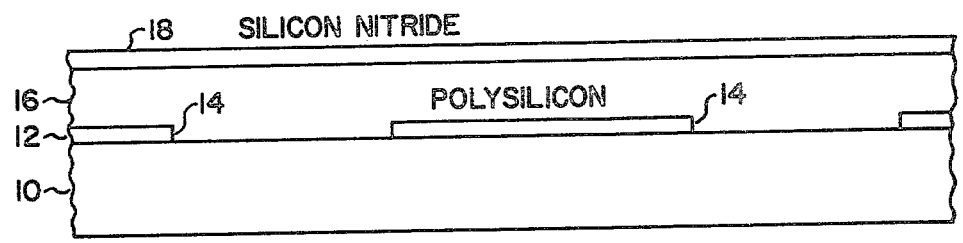

As shown in FIG. 3, a layer 16 of polycrystalline silicon, often called polysilicon, is then deposited over the silicon dioxide layer 12. The polysilicon layer 16 may be formed by chemical vapor deposition to a thickness of 1000 to 5000 A. Also shown in FIG. 3 is a layer 18 of oxidation barrier material, such as silicon nitride, which is deposited over the polysilicon layer 16. The silicon nitride layer 18 may be 500 to 1000 A thick and may be formed by chemical vapor deposition.

Figure 4:
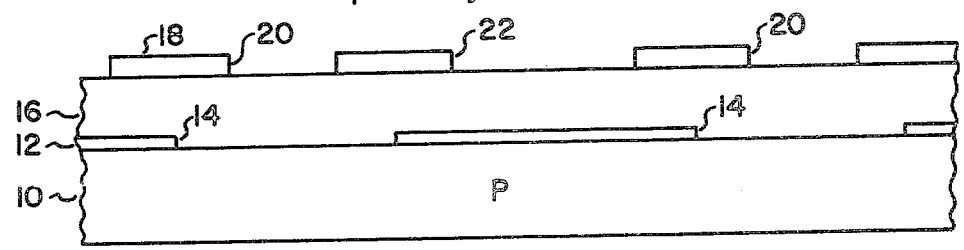

After the silicon nitride layer 18 is deposited, a second photolighographic mask, not shown, is applied to the layer 18 and the layer 18 is etched selectively to produce two sets of openings 20 and 22 of different sizes, shown in FIG. 4. The openings 20 and 22 define the outer limits of the cell capacitor and transistor structure.

The openings 20 are smaller than the openings 22 and also smaller than the openings 14 in the silicon dioxide layer 12. The remaining portions of the silicon nitride layer 18 are generally centered over the edges of the openings 14, but the alignment is not critical. The openings 20 are generally less than one-half the size of the openings 14. The larger openings 22 in the silicon nitride layer 18 are smaller than the width of the silicon dioxide layer 12 extending between the openings 14 in the silicon dioxide layer 12.

Figure 5:
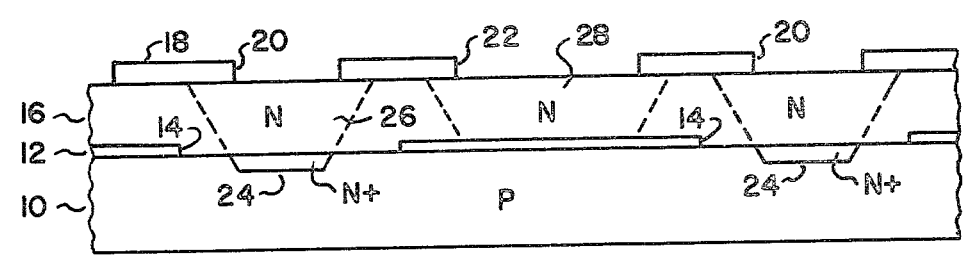

Referring now to FIG. 5, the next step is to implant or diffuse an impurity of second conductivity type. In this case where the substrate is P type, a heavy concentration of N type impurity, such as $10^{21}$ atoms/cc of phosphorus, is applied to the surface of the structure containing the silicon nitride layer 18. During the application of N type dopant the silicon nitride layer 18 acts as an impurity deposition mask to delineate the regions where the N type impurity atoms are deposited. The impurity atoms are deposited through the openings 20 and 22 in the silicon nitride layer 18.

In the regions of the smaller openings 20, the N+ impurities pass through the polysilicon layer 16 and form a first N+ semiconductor region 24 in the surface of the substrate 10, in addition to converting the polysilicon layer 16 to N doped polysilicon regions 26. In the regions of the larger openings 22, the N+ impurities deposit in the polysilicon layer 16 to convert the layer 16 to N doped polysilicon regions 28, but the N+ impurities are blocked by the silicon dioxide layer 12 from entering the silicon substrate 10. As will become apparent, the N+ semiconductor region 24 will become the source of the MOS transistor, the polysilicon region 26 will become the bit line, and the polysilicon region 28 will become the capacitor field plate.

Figure 6:
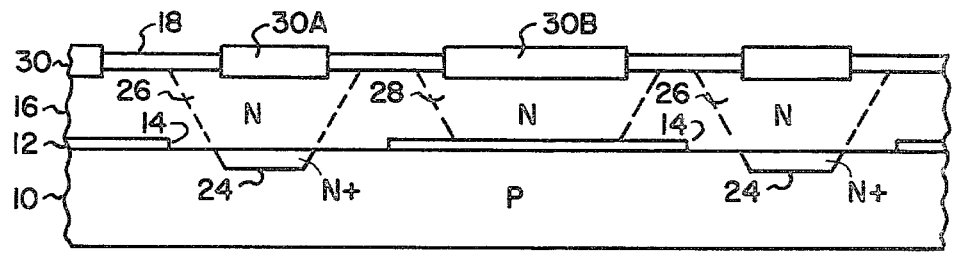

In the next step, shown in FIG. 6, the polysilicon layer 16 is locally oxidized by heating to 850° C. in an oxidizing atmosphere. During this operation, the silicon nitride layer 18 serves as an oxidation barrier or masking layer so that an oxide layer 30 is formed in and on the exposed surface only of the polysilicon layer 16. The local oxide layer 30 extends below and above the surface level of the regions of the polysilicon layer 16 that are protected by the silicon nitride layer 18. The local oxide layer 30 is self-aligned with the silicon nitride masking layer 18 and has a layer portion 30A aligned with the first N+ semiconductor region 24 and a wider layer portion 30B overlying the silicon dioxide layer 12 and N doped polysilicon region 28. During the time the substrate 10 is heated to form the local oxide layer 30, the N+ semiconductor region 24 is driven deeper into the silicon substrate 10.

Figure 7:
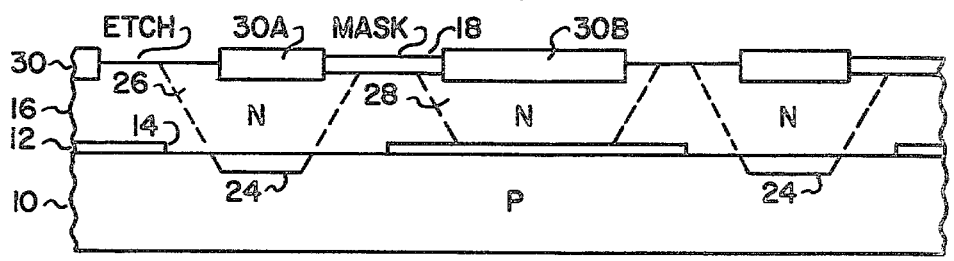

In the next step shown in FIG. 7, portions of the silicon nitride layer 18 are removed from only one side adjacent the smaller layer portion 30A of the local oxide layer 30, the smaller local oxide layer portion 30A being the one overlying the N+ semiconductor region 24. The selective removal of the silicon nitride layer portions may be accomplished with the aid of a photoresist etch mask, by etching the silicon nitride through the holes in the etch mask utilizing hot phosphoric acid.

Figure 8:
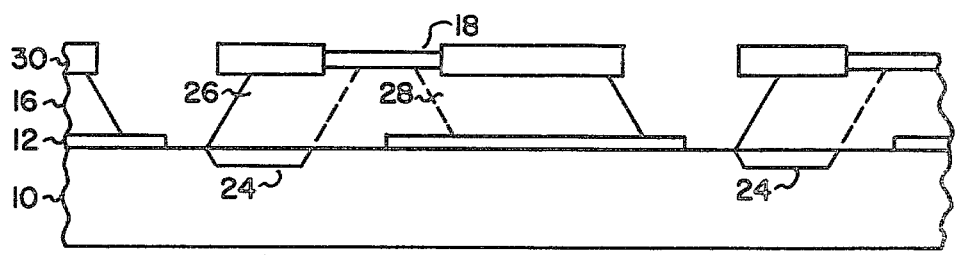

The next step is shown in FIG. 8 and consists of removing the exposed portions of the polysilicon layer 16, down to the surface of the substrate 10. A suitable etchant for the polysilicon is a solution of potassium hydroxide (KOH).

After the polysilicon is removed there may yet remain small portions of the thin silicon dioxide layer 12 in the polysilicon layer voids. The thin silicon dioxide layer portions may be removed with hydrofluoric acid without removing much of the thicker local oxide layer 30.

Figure 9:
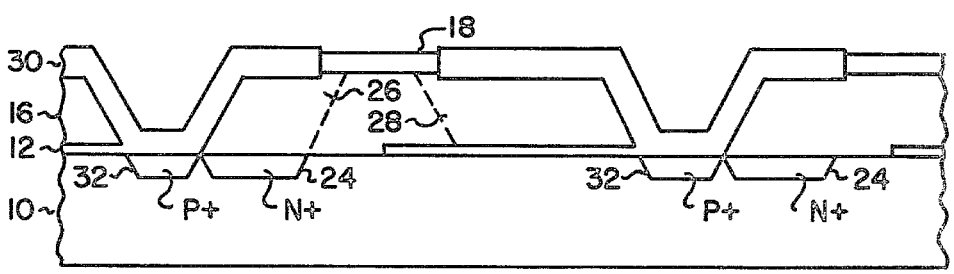

FIG. 9 shows the next step wherein a second impurity deposit is made, this time a P+ deposit, to produce P+ semiconductor regions 32 in the surface of the substrate 10. The P+ semiconductor regions 32 may be formed by ion implanting or diffusing a heavy concentration of boron atoms. The boron atoms for the P+ deposit pass through the voids in the polysilicon layer 16 but are blocked everywhere else by the local oxide layer 30 and the silicon nitride layer 18. The P+ boron atoms of first conductivity type lodge next to the N+ semiconductor region 24 of second conductivity type to form the P+ semiconductor regions 32.

After the P+ boron atoms for the regions 32 are deposited, they are driven deeper into the silicon substrate 12 by a drive-in diffusion at elevated temperature. During the thermal diffusion, oxide formation occurs on the P+ semiconductor regions 32 and on the polysilicon surface where the voids are located so as to produce a continuation of the local oxide layer 30.

The P+ semiconductor regions 32 will function as isolation regions for the cells by preventing leakage therebetween. The P+ semiconductor regions 32 and the N+ semiconductor regions 24 overlap each other slightly.

Figure 10:
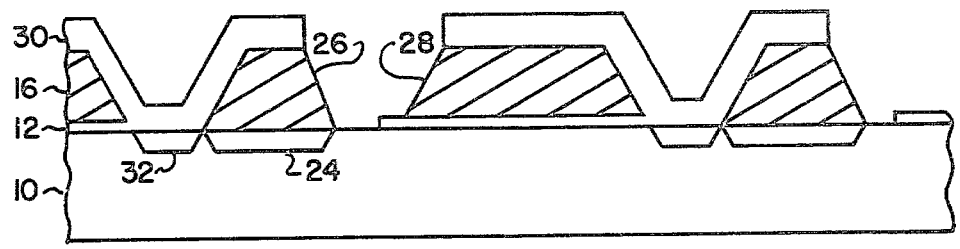

The next processing step is shown in FIG. 10 and consists of first etching the silicon nitride layer 18 and then etching the polysilicon layer 16 thus exposed by the removal of the silicon nitride layer 18. This step of etching the polysilicon layer 16 removes the polysilicon material between the two N doped regions 26 and 28 of the polysilicon layer 16. Such separation of the polysilicon layer 16 into the two regions 26 and 28 results in the formation of the polysilicon region 26 as the bit line and polysilicon region 28 as the capacitor field plate and drain-forming element of the MOS transistor. The N+ semiconductor region 24, which lies beneath the N doped polysilicon region 26 serving as the bit line, will serve as the source of the MOS transistor.

Figure 11:
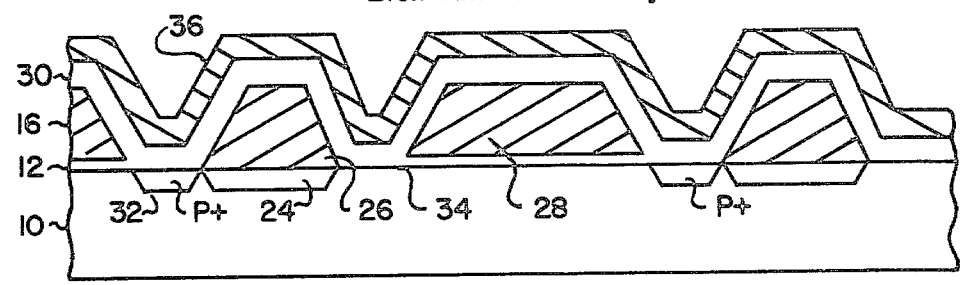
Figure 12:
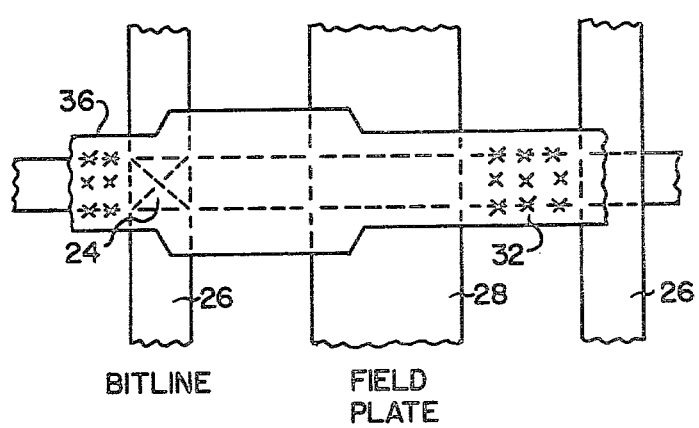
FIG. 12 is a top view of the memory cell.

All that remains to be done now is to form the gate of the MOS transistor. This series of steps is shown in FIG. 11 and consists in first removing the remaining portions of the silicon dioxide layer 12 from the surface of the substrate 10 next to the bare sides of the two polysilicon regions 26 and 28 shown in FIG. 10. Then, a thin gate oxide layer 34 is formed on the cleaned surface of the silicon substrate 10 and on the bare sides of the polysilicon regions 26 and 28 so as to merge with the local oxide layer 30. The gate oxide layer 34 may be 200-1000 Å thick and may be thermally grown. Now that the entire structure is covered with oxide insulation, a second polysilicon layer can be deposited over the oxide layers 30 and 34 and patterned into a line structure to form the gate electrodes 36 extending perpendicular to the bit lines, or N doped polysilicon regions 26, as shown in FIG. 12. Each gate electrode 36 extends over the gate oxide layer 34 above the channel region of the MOS transistor extending between the source region 24 and the drain-forming polysilicon region 28.

The polysilicon region 28 forming the capacitor field plate is insulated from the silicon substrate 10 by the thin silicon dioxide layer 12. The polysilicon region 28 also functions to locate the drain of the MOS transistor. In operation, a high positive voltage applied to the polysilicon region 28 will cause an inversion layer to be induced in the silicon surface underlaying the region 28. The inversion layer is of the same conductivity type as the source region 24 and will thus function as the drain of the MOS transistor.

Figure 13:
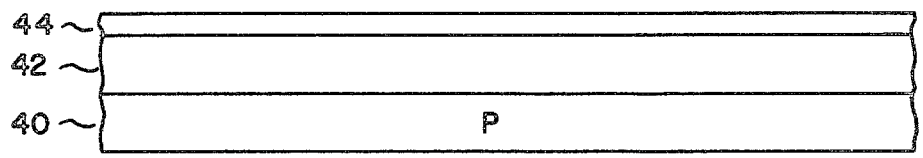
FIGS. 13-20 are cross-sectional views showing a pair of source, gate, drain MOS transistors in various stages of a fabrication process according to the invention.

A similar process can be used to fabricate a plurality of MOS transistors and this process will now be described. Referring to FIG. 13, a semiconductor substrate 40 of P type is provided directly with a polysilicon layer 42, it being noted that the silicon dioxide layer 12 of the previously described process is omitted in this case because it is not necessary to form a capacitor over the drain region. A silicon nitride layer 44 is then deposited on the polysilicon layer 42.

Figure 14:
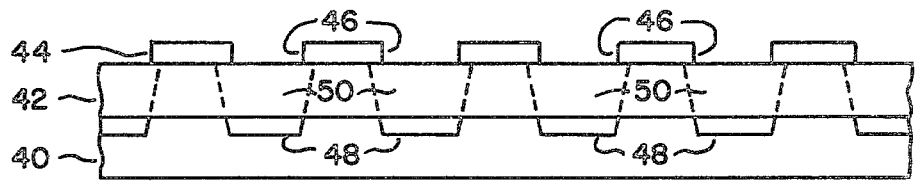

Referring now to FIG. 14, the silicon nitride layer 44 is patterned to provide openings 46, whose size and spacings may be equal. An N type impurity is now diffused or implanted through the openings 46 and driven in to produce N+ semiconductor regions 48 in the substrate 40 and N doped polysilicon regions 50.

Figure 15:
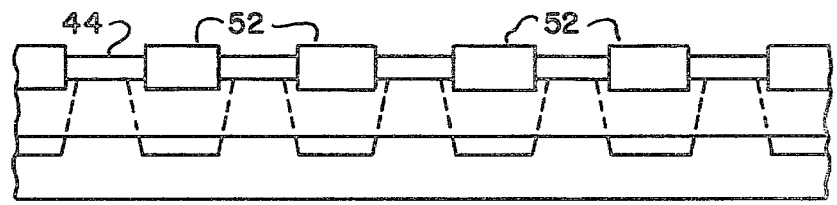
Figure 16:
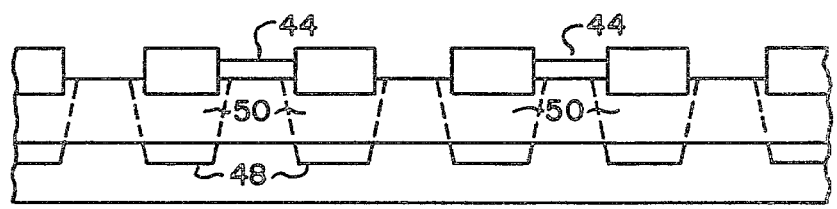
Figure 17:
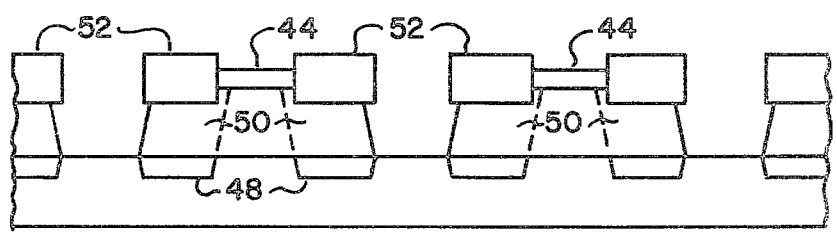

Next, a local oxide layer 52 is formed in the openings 46, as shown in FIG. 15. Following this, alternate portions of the silicon nitride layer 44 are removed, as shown in FIG. 16, exposing the polysilicon layer 42 where the silicon nitride is removed. As shown in FIG. 17, the polysilicon layer 42 is now etched through its entire depth in the areas unmasked by the silicon nitride layer 44.

Figure 18:
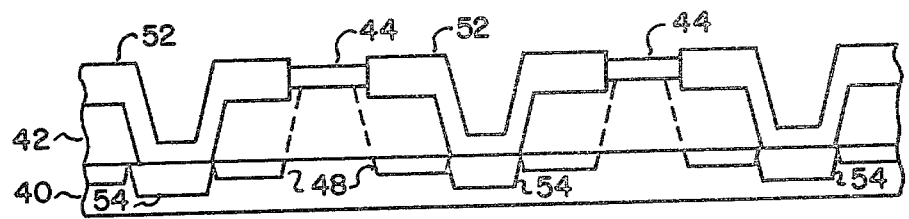

After the polysilicon layer 42 is etched, a P type dopant is heavily implanted or diffused and the dopant is driven into the substrate 40 to produce the P+ semiconductor regions 54 shown in FIG. 18. During the drive-in diffusion, oxide is formed on the bare sides of the polysilicon layer 42 and on the surface of the P+ regions 54, to produce a continuation of the silicon dioxide layer 52.

Figure 19:
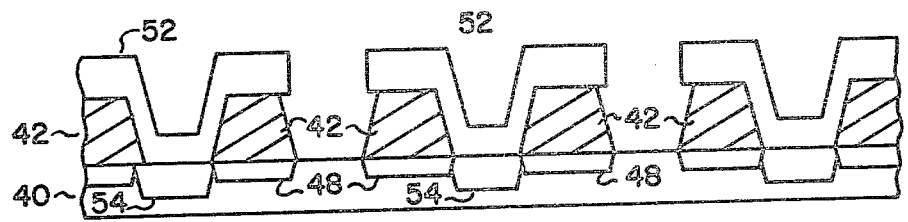

The next two steps are shown in FIG. 19 and they include first the removal of the remaining silicon nitride layer 44 and then etching of the polysilicon layer 42 where the silicon nitride layer 44 has been removed. The polysilicon layer 42 is etched through its entire depth down to the surface of the substrate 40.

Figure 20:
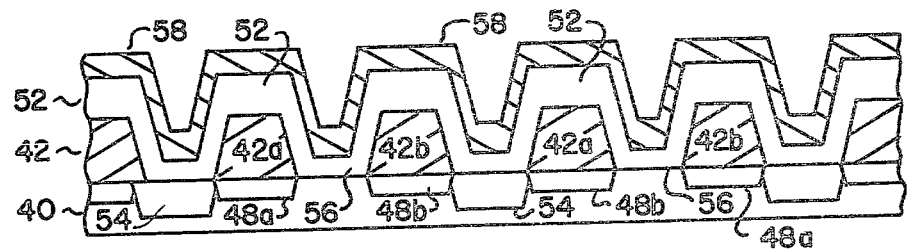

The structure is now ready for the formation of the gate oxide layer 56, which may be thermally grown on the exposed surface of the substrate 40, as shown in FIG. 20. While the gate oxide 56 is being grown on the substrate 40, oxide forms also on the bare sides of the polysilicon layer 42 and merges with the thick oxide layer 52 to form a continuous protective oxide layer on which a polysilicon gate electrode 58 can be deposited.

Figure 21:
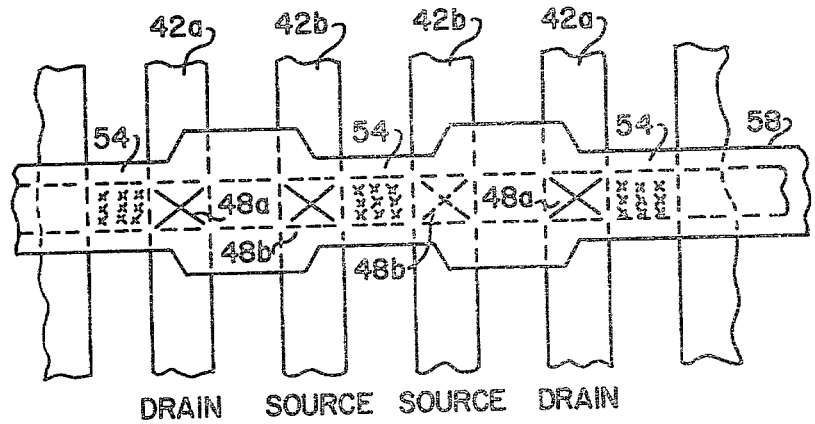
FIG. 21 is a top view of the MOS transistors.

Each MOS transistor incudes two of the N+ semiconductor regions 48 separated by a channel or surface region of the substrate 40 underlying the gate oxide 56, and the gate electrode 58. One of the N+ regions, such as 48a shown in FIGS. 20 and 21, may be the drain, and the other N+ region 48b may be the source when the transistor is connected into a circuit. Each transistor is isolated from the other by the P+ semiconductor regions 54. The transistors may alternate drain 48a, source 48b, source 48b, drain 48a, with corresponding drain electrodes 42a, source electrode 42b, source electrode 42b, drain electrodes 42a, in that order. Each transistor is separated by a P+ isolation region 54.

Figure 22:
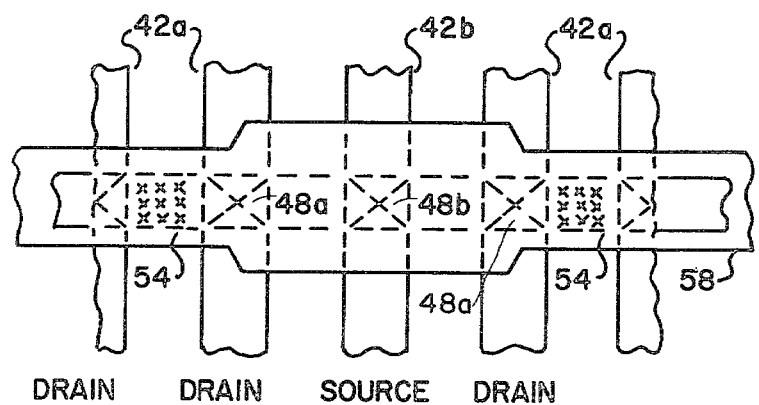
FIG. 22 is a top view showing another arrangement of two MOS transistors located side-by-side.

Alternatively, two adjacent transistors may share a common source region 48b between two drain regions 48a, with corresponding polysilicon source electrode 42b between two polysilicon drain electrodes 42a, as shown in the top plan view of FIG. 22. In this case the P+ isolation regions 54 are next to the two outer drain regions 48a, and each P+ isolation region 54 isolates a pair of MOS transistors.

What is claimed is:

1. A method of fabricating a structure including a plurality of MOS transistors, comprising:
   (a) providing a first layer of polysilicon over a substrate of first conductivity type;
   (b) depositing over said first polysilicon layer a masking layer which provides a barrier to oxide formation;
   (c) patterning said masking layer to form a plurality of spaced openings therein alternating with masking layer portions;
   (d) introducing impurities of second conductivity type opposite said first conductivity type through said openings to increase the conductivity of said polysilicon layer in the regions beneath said openings and also to produce spaced apart surface regions of second conductivity type in said substrate;
   (e) locally oxidizing said polysilicon layer in the areas uncovered by said oxidation barrier layer;
   (f) removing alternate masking layer portions and the underlying polysilicon layer portions by selective etching to produce voids extending through said polysilicon layer;
   (g) introducing impurities of first conductivity type through said voids to produce isolation regions in the surface of said substrate which separate said surface regions of second conductivity type into pairs, at least one surface region of second conductivity type alternating with one isolation region;
   (h) oxidizing the bare sides of said polysilicon layer;
   (i) removing the remaining masking layer portions and the underlying polysilicon layer portions by selective etching to provide yet other voids extending through said polysilicon layer, thereby exposing the surface of said substrate adjacent to said second conductivity type surface regions;
   (j) forming a continuous insulating layer on the substrate surface thereby exposed in step (i) and also on the exposed sides of said polysilicon layer; and
   (k) forming a second polysilicon layer over said continuous insulating layer.

2. The invention according to claim 1, wherein the openings in said masking layer are all of the same width.

3. The invention according to claim 1, wherein the openings in said masking layer are of two sizes, with a narrower opening alternating with a wider opening.

4. The invention according to claim 1, wherein the step in (g) produces single isolation regions alternating with single surface regions of second conductivity type.

5. The invention according to claim 1, wherein the step in (g) produces single isolation regions alternating with pairs of surface regions of second conductivity type.

6. The invention according to claim 1, wherein the step in (a) is produced by the step of forming a thin insulating layer provided with a pattern of openings on the surface of the substrate.

7. The invention according to claim 1, wherein the polysilicon layer in step (a) is provided directly on the substrate.

8. The invention according to claim 1 wherein said masking layer comprises silicon nitride.

9. The invention according to claim 1, wherein said substrate is formed of silicon and said continuous insulating layer formed in step (j) is silicon dioxide.

10. A method of fabricating an integrated circuit array of single capacitor, single MOS transistor memory cells, comprising:
(a) providing a thin first insulating layer on a substrate of first conductivity type.
(b) forming openings in said first insulating layer;
(c) depositing a first layer of polysilicon over said first insulating layer;
(d) depositing over said first polysilicon layer a masking layer of material different from that of said first insulating layer and which provides a barrier to oxide formation;
(e) forming a first set of openings in said masking layer of smaller dimension than the openings in said first insulating layer and generally aligned therewith and forming a second set of openings in said masking layer that are offset from the openings in said first insulating layer;
(f) introducing impurities of second conductivity type opposite said first conductivity type through the openings in both said insulating and masking layers to form spaced regions of increased conductivity in said polysilicon layer and to form in said substrate beneath said first set of openings a plurality of regions of second conductivity type, each of which latter regions is to serve as a source region, said insulating and masking layers serving to block said impurities from depositing in regions underlying them;
(g) locally oxidizing said first polysilicon layer to form a layer of silicon dioxide only in regions of said polysilicon layer not covered by said masking layer, said silicon dioxide layer being self-aligned with the openings in said masking layer and having layer portions aligned with said source regions;
(h) removing material of said masking layer from regions adjacent to one side only of each of said silicon dioxide layer portions so as to expose selected portions only of said first polysilicon layer and leave the remainder of said masking layer covering regions of said polysilicon layer on the opposite side of said silicon dioxide layer portions;
(i) etching to remove the exposed selected portions only of said first polysilicon layer and form voids therein;
(j) introducing impurities of the first conductivity type so that they pass through the voids in said first polysilicon layer and deposit in said substrate to form isolation regions adjacent to said source regions;
(k) forming a layer of silicon dioxide on the exposed portions of said first polysilicon layer;
(l) removing the remainder of said masking layer to expose portions of said first polysilicon layer not covered by silicon dioxide;
(m) etching to remove the portions of said first polysilicon layer not covered by silicon dioxide to form a pattern of elements including a first polysilicon element in contact with each source region to serve as a bit line and a second polysilicon element spaced from said first polysilicon element and spaced from said substrate by said first insulating layer to serve as a capacitor plate overlying a drain region;
(n) removing said first insulating layer from the substrate region between said polysilicon elements;
(o) forming a second thin insulating layer over the exposed surfaces of said polysilicon elements and over said substrate; and
(p) forming a pattern of lines from a second polysilicon layer over said second thin insulating layer and over said silicon dioxide layer and crossing said pattern of polysilicon elements, each of said lines to serve as a gate electrode and word line.

11. The invention according to claim 10, wherein the openings in said first insulating layer formed by step (b) are narrower than the spacing between said openings.

12. The invention according to claim 11, wherein the width of the first set of openings in said masking layer formed in step (e) are less than one-half the width of the openings in said first insulating layer.

13. A method of fabricating a plurality of MOS transistors, comprising:
(a) providing a first layer of polysilicon over a substrate of first conductivity type;
(b) depositing over said first polysilicon layer a masking layer which provides a barrier to oxide formation;
(c) patterning said masking layer to form a plurality of spaced openings therein alternating with masking layer portions;
(d) introducing impurities of second conductivity type opposite said first conductivity type through said openings to increase the conductivity of said polysilicon layer in the regions beneath said openings and also to produce spaced apart surface regions of second conductivity type in said substrate;
(e) locally oxidizing said polysilicon layer in the areas uncovered by said masking layer;
(f) removing alternate masking layer portions and the underlying polysilicon layer portions by selective etching to produce voids extending through said polysilicon layer;
(g) introducing impurities of first conductivity type through said voids to produce isolation regions in the surface of said substrate which separate said surface regions of second conductivity type into pairs;
(h) oxidizing the bare sides of said polysilicon layer;
(i) removing the remaining masking layer portions and the underlying polysilicon layer portions by selective etching to produce yet other voids extending through said polysilicon layer, thereby exposing the surface of said substrate between each pair of second conductivity type surface regions;
(j) forming a continuous insulating layer on the substrate surface thereby exposed in step (i) and also on the exposed sides of said polysilicon layer; and
(k) forming a second polysilicon layer over said continuous insulating layer.

14. The invention according to claim 13, wherein the openings in said masking layer are uniform and equal in width and spacing.

* * * * *